(12) United States Patent
Cho et al.

(10) Patent No.: US 8,399,777 B2
(45) Date of Patent: Mar. 19, 2013

(54) ELECTROMAGNETIC BANDGAP STRUCTURE AND PRINTED CIRCUIT BOARD HAVING THE SAME

(75) Inventors: Won Woo Cho, Busan (KR); Young Soo Kim, Gyeongsangbuk-do (KR); Yoon Jung Kim, Gyeongsangbuk-do (KR); Dek Gin Yang, Chungcheongbuk-do (KR); Myung Gun Chong, Gyeongsangnam-do (KR); Hyung Ho Kim, Incheon (KR)

(73) Assignees: Samsung Electro-Mechanics Co., Ltd., Suwon, Gyunggi-do (KR); Postech Academy-Industry Foundation, Pohang-si, Gyeongsangbuk-do (KR)

( * ) Notice: Subject to any disclaimer, the term of this patent is extended or adjusted under 35 U.S.C. 154(b) by 353 days.

(21) Appl. No.: 12/650,489

(22) Filed: Dec. 30, 2009

(65) Prior Publication Data

US 2010/0252320 A1 Oct. 7, 2010

(30) Foreign Application Priority Data

Apr. 7, 2009 (KR) ........................ 10-2009-0029963

(51) Int. Cl.
*H05K 9/00* (2006.01)
*H01F 27/26* (2006.01)
*H01F 5/00* (2006.01)

(52) U.S. Cl. ........ 174/257; 174/252; 174/256; 174/262; 174/267; 361/763; 361/766; 361/784; 361/816; 361/818; 333/12; 333/22 R; 333/185; 343/700 MS; 343/909

(58) Field of Classification Search .......... 174/250–267, 174/360, 367; 361/760–767, 780–788, 790–795, 361/772, 816, 818; 333/12, 167, 175, 185, 333/246, 202, 204, 212; 343/700 MS, 729, 343/767, 762, 771, 909, 829, 846, 853, 860; 336/147, 200, 181, 223, 232, 186; 257/532, 257/533, 621, 664, 665, 697, 724, 786
See application file for complete search history.

(56) References Cited

U.S. PATENT DOCUMENTS 5,610,569 A * 3/1997 Hwang et al. ................. 336/200
5,696,471 A * 12/1997 Fujiwara ....................... 333/177
(Continued)

FOREIGN PATENT DOCUMENTS

JP 2006032769 A * 2/2006
KR 10-2009-0029573 A 3/2009

OTHER PUBLICATIONS

Office Action from counterpart Korean Patent Application No. 10-2009-0029963, Dec. 7, 2010, 3 pages.

*Primary Examiner* — Michail V Datskovskiy
(74) *Attorney, Agent, or Firm* — Blakely Sokoloff Taylor & Zafman LLP

(57) ABSTRACT

Disclosed herein are an electromagnetic bandgap structure and a printed circuit board having the same. The bandgap structure includes a conductive layer including a plurality of conductive plates, a first metal layer disposed under the conductive layer and including a first stitching pattern electrically connected to a first conductive plate of the plurality of conductive plates, and a second metal layer disposed under the first metal layer and including a second stitching pattern electrically connected to both the first stitching pattern and a second conductive plate of the plurality of conductive plates. The bandgap to structure includes stitching patterns formed in two layers different from the conductive layer, thus offering a stop-band having a desired bandwidth in a compact structure.

8 Claims, 6 Drawing Sheets

U.S. PATENT DOCUMENTS

| | | | |
|---|---|---|---|
| 6,002,593 A * | 12/1999 | Tohya et al. | 361/765 |
| 6,091,310 A * | 7/2000 | Utsumi et al. | 333/12 |
| 6,222,427 B1 * | 4/2001 | Kato et al. | 333/185 |
| 6,236,297 B1 * | 5/2001 | Chou et al. | 336/200 |
| 6,384,706 B1 * | 5/2002 | Iwanami | 336/200 |
| 6,384,797 B1 * | 5/2002 | Schaffner et al. | 343/795 |
| 6,587,025 B2 * | 7/2003 | Smith et al. | 336/200 |
| 6,806,793 B2 * | 10/2004 | Bhatia et al. | 333/175 |
| 6,931,712 B2 * | 8/2005 | Long et al. | 29/602.1 |
| 6,963,034 B2 * | 11/2005 | Iwanami | 174/260 |
| 6,970,057 B2 * | 11/2005 | Lin et al. | 333/177 |
| 7,071,889 B2 * | 7/2006 | McKinzie et al. | 343/756 |
| 7,088,215 B1 * | 8/2006 | Winter et al. | 336/200 |
| 7,211,533 B2 * | 5/2007 | Kawada et al. | 501/128 |
| 7,433,647 B2 * | 10/2008 | LeMense et al. | 455/41.1 |
| 7,518,248 B2 * | 4/2009 | Li et al. | 257/774 |
| 7,528,788 B2 * | 5/2009 | Dunn et al. | 343/795 |
| 7,733,207 B2 * | 6/2010 | Yun et al. | 336/200 |
| 7,884,697 B2 * | 2/2011 | Wei et al. | 336/200 |
| 7,936,232 B2 * | 5/2011 | Song et al. | 333/12 |
| 8,134,425 B2 * | 3/2012 | Rofougaran et al. | 333/174 |
| 2005/0247999 A1 * | 11/2005 | Nishikawa et al. | 257/531 |
| 2007/0236319 A1 * | 10/2007 | Hsu et al. | 336/200 |
| 2009/0179722 A1 * | 7/2009 | Goyette et al. | 336/186 |

* cited by examiner

ELECTROMAGNETIC BANDGAP STRUCTURE AND PRINTED CIRCUIT BOARD HAVING THE SAME

CROSS REFERENCE TO RELATED APPLICATION

This application claims the benefit of Korean Patent Application No. 10-2009-0029963, filed on Apr. 7, 2009, entitled "Electromagnetic band gap structure and a printed circuit board comprising the same", which is hereby incorporated by reference in its entirety into this application.

BACKGROUND OF THE INVENTION

1. Field of the Invention

The present invention relates to an electromagnetic bandgap structure, and more particularly to an electromagnetic bandgap structure capable of blocking noise of a specific frequency band and a printed circuit board having the same.

2. Description of the Related Art

With the recent rapid advancement of technologies and services relating to cable and radio broadcasting and communication, the strength of users' demands for products is heightened. In order to realize the reduction in size of products for the sake of portability, an increase in battery performance and multifunctionality of products (which are required to satisfy the above demands), operating speed and bandwidth of electronic products are rapidly being increased. With the increase in operating speed, a clock frequency falls within a GHz range, and thus problems concerned with power integrity (PI), signal integrity (SI) and EMI caused by Simultaneous Switching Noise (SSN) generated from various on/off chips or packages such as digital blocks positioned on a multilayered PCB are emerging as critical issues in PCB design.

SSN, which is also known as a delta-I noise or ground bounce noise, is a source of serious noise on a multilayered PCB. The SSN is caused by time-varying current that rapidly varies in a high-speed digital circuit. SSN, which is generated between a power layer and a ground layer, affects an adjacent signal line, thus not only exerting an influence on signal integrity (SI) but also causing radiation of electromagnetic waves at a peripheral region of a PCB.

More specifically, when a lot of switching devices are switched concurrently, high-speed current passing through vias between multilayered PCBS causes propagation of an undesired electromagnetic wave through a substrate. Since the generated electromagnetic waves may affect transmission characteristics of a signal passing through vias, the electromagnetic waves may serve as a noise source affecting other devices and may increase EMI radiated from a peripheral region of a PCB to the outside.

FIG. 1 is a schematic cross-sectional view of a printed circuit board 10 on which two different electronic circuits 30 and 50 are mounted. The printed circuit board 10 includes power and ground layers 11 and 13 for supplying power to the two electronic circuits 30 and 50, signal lines 17 and a via 15 for signal transmission between the signal lines 17.

As shown in the drawing, when the electronic circuits 30 and 50 operating at different frequencies are mounted on a printed circuit board, electromagnetic waves caused by an operating frequency and harmonic components of one of the two electronic circuits are transmitted to the other electronic circuit and interfere with electromagnetic waves originating from the other electronic circuit, thus causing noise.

The most typical solution to solve the problems of influencing PI and SI and EMI, which occur as a result of the SSN generated from a high-speed digital system, is to connect a decoupling capacitor between the power layer and the ground layer. In addition, since a feedback current pathway having low impedance is provided through the decoupling capacitor, noise propagated through parallel conductive plates can be blocked. However, in order to reduce SSN for a lot of vias, there is a need for a lot of decoupling capacitors, which increases both production costs and an area of a PCB occupied by the decoupling capacitors, thus restricting the free arrangement of other elements on the PCB. Furthermore, parasitic impedance of the decoupling capacitors causes another problem of parallel resonance. Therefore, the decoupling capacitors are not so efficient in reducing noise occurring from a PCB in a high-frequency band of 1 GHz or more which is causing to trouble for recent high-speed digital systems.

For this reason, research on an electromagnetic bandgap (EBG) structure which is capable of selecting a frequency so as to solve the problems of SSN occurring in the GHz band is being intensively conducted. The electromagnetic bandgap structure cannot only solve the problem of SSN using the characteristic in which high impedance occurs in a specific frequency band but can also solve problems such as the increased cost resulting from use of the decoupling capacitors and the restriction in free arrangement of elements.

Among EBGs, a mushroom type EBG structure and a planar type EBG structure are typically known in the art. However, the conventional EBG structures have disadvantages in that they are hard to design so as to have a stop-band at a desired size which is small enough to be incorporated in a compact electronic device such as a cellular phone.

Accordingly, in response to the above problems, development of an EBG structure which can be reduced in size is eagerly required.

SUMMARY OF THE INVENTION

Accordingly, the present invention has been made keeping in mind the above problems occurring in the prior art, and the present invention proposes an electromagnetic bandgap structure which can provide a reduction in size and desired frequency response characteristics.

In an aspect, the present invention provides an electromagnetic bandgap structure including: a conductive layer including a plurality of conductive plates; a first metal layer disposed under the conductive layer and including a first stitching pattern electrically connected to a first conductive plate of the plurality of conductive plates; and a second metal layer disposed under the first metal layer and including a second stitching pattern electrically connected to both the first stitching pattern and a second conductive plate of the plurality of conductive plates.

The first stitching pattern may include a pattern part having a spiral shape, a staggered shape or a curved horseshoe shape.

The second stitching pattern may include a pattern part having a spiral shape, a staggered shape or a curved horseshoe shape.

The electromagnetic bandgap structure may further include: a first dielectric layer disposed between the conductive layer and the first metal layer; a second dielectric layer disposed between the first metal layer and the second metal layer; a first via penetrating through the first dielectric layer so as to form an electrical connection between the first conductive plate and the first stitching pattern; a second via penetrating through the second dielectric layer so as to form an electrical connection between the first stitching pattern and the second stitching pattern; and a third via penetrating through the first and second dielectric layers so as to form an electrical connection between the second conductive plate and the second stitching pattern.

The conductive layer may include a peripheral part surrounding the plurality of conductive plates with clearances formed therebetween.

The first metal layer may include a first peripheral part surrounding the first stitching pattern with clearances formed therebetween.

The second metal layer may include a second peripheral part surrounding the second stitching pattern with clearances formed therebetween.

The plurality of conductive plates may be electrically connected to each other through the first and second stitching patterns.

The conductive layer may be a power layer or a ground layer.

The peripheral part may be electrically connected to the plurality of conductive plates.

In another aspect, the present invention provides an electromagnetic bandgap structure including: a plurality of conductive plates; and a stitching via including a first stitching pattern disposed under the plurality of conductive plates and electrically connected to a first conductive plate of the plurality of conductive plates, and a second stitching pattern disposed under the first stitching pattern and electrically connected to both the first stitching pattern and a second conductive plate of the plurality of conductive plates, so as to connect the first conductive plate to the second conductive plate.

In a further aspect, the present invention provides an electromagnetic bandgap structure including: a plurality of conductive plates; and a stitching via formed in two metal layers different from the plurality of conductive plates so as to connect the plurality of conductive plates to each other.

In still another aspect, the present invention provides a printed circuit board including: two electronic circuits with different operating frequencies; and an electromagnetic bandgap structure including: a plurality of conductive plates; and a stitching via including a first stitching pattern disposed under the plurality of conductive plates and electrically connected to a first conductive plate of the plurality of conductive plates, and a second stitching pattern disposed under the first stitching pattern and electrically connected to both the first stitching pattern and a second conductive plate of the plurality of conductive plates, so as to connect the first conductive plate to the second conductive plate.

BRIEF DESCRIPTION OF THE DRAWINGS

The above and other objects, features and advantages of the present invention will to be more clearly understood from the following detailed description taken in conjunction with the accompanying drawings, in which.

DESCRIPTION OF THE PREFERRED EMBODIMENTS

Figure 1:
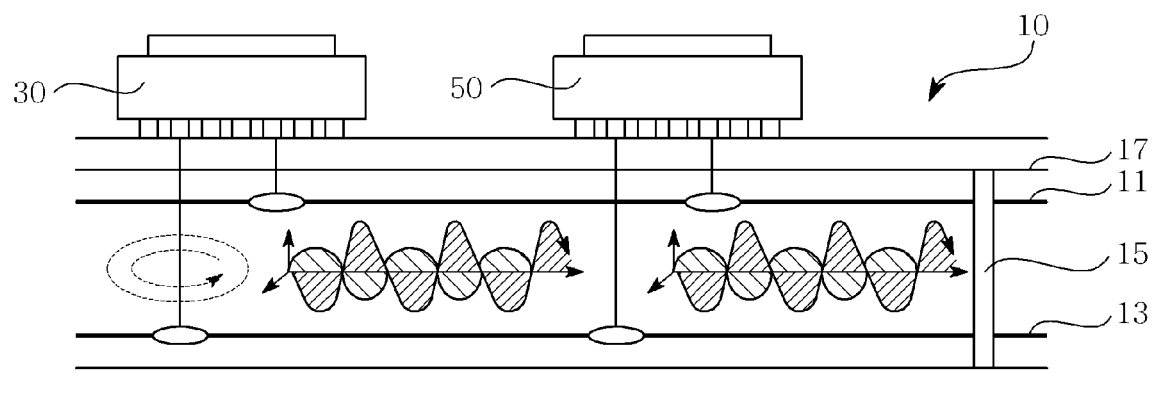
FIG. 1 is a schematic cross-sectional view of a printed circuit board on which two different electronic circuits with different operating frequencies are mounted.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

Hereinafter, a printed circuit board having round solder bumps according to the present invention will be described in greater detail with reference to the accompanying drawings. Throughout the accompanying drawings, the same reference numerals are used to designate the same or similar components, and redundant descriptions thereof are omitted. In the following description, the terms "upper", "lower" and the like are used to differentiate a certain component from other components, but the configuration of such components should not be construed to be limited by the terms.

Figure 2:
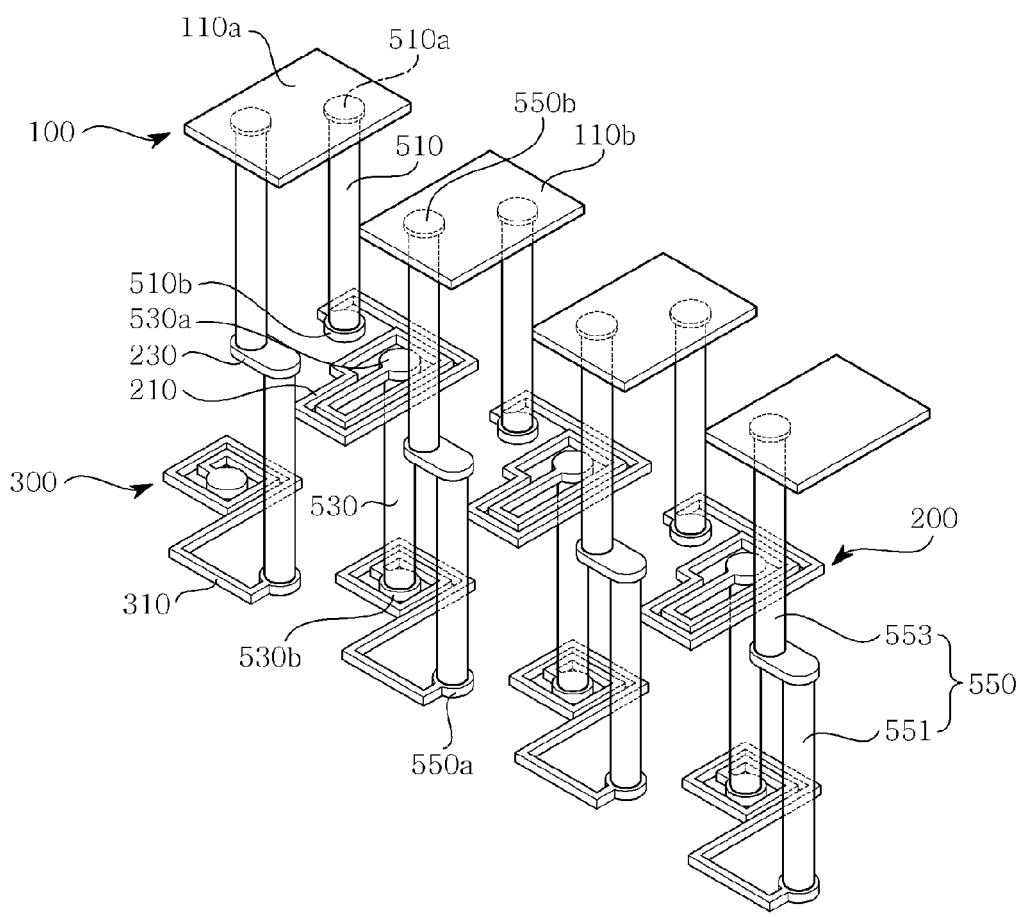
FIG. 2 is a schematic view showing an electromagnetic bandgap structure according to an embodiment of the present invention.
Figure 3:
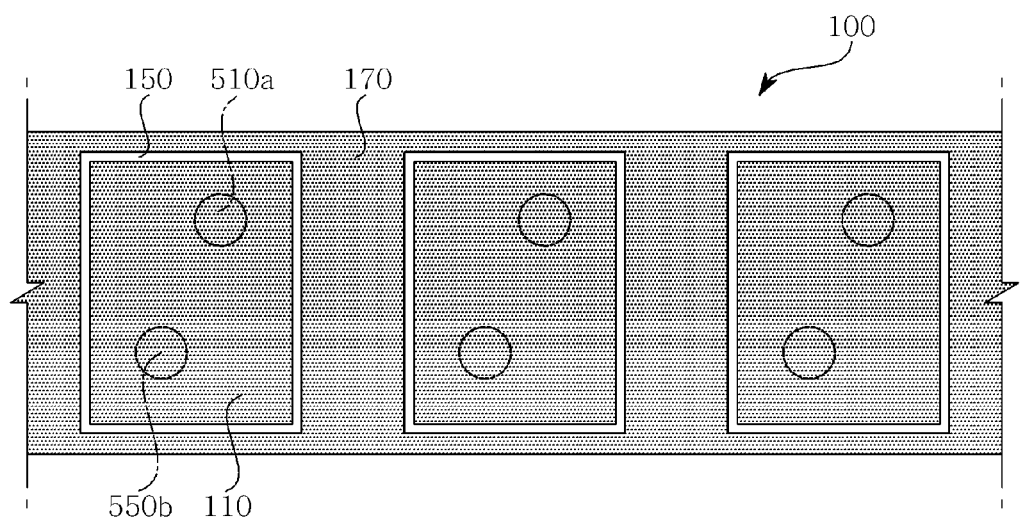
FIG. 3 is a plan view showing a conductive layer of the electromagnetic bandgap structure shown in FIG. 2.
Figure 4:
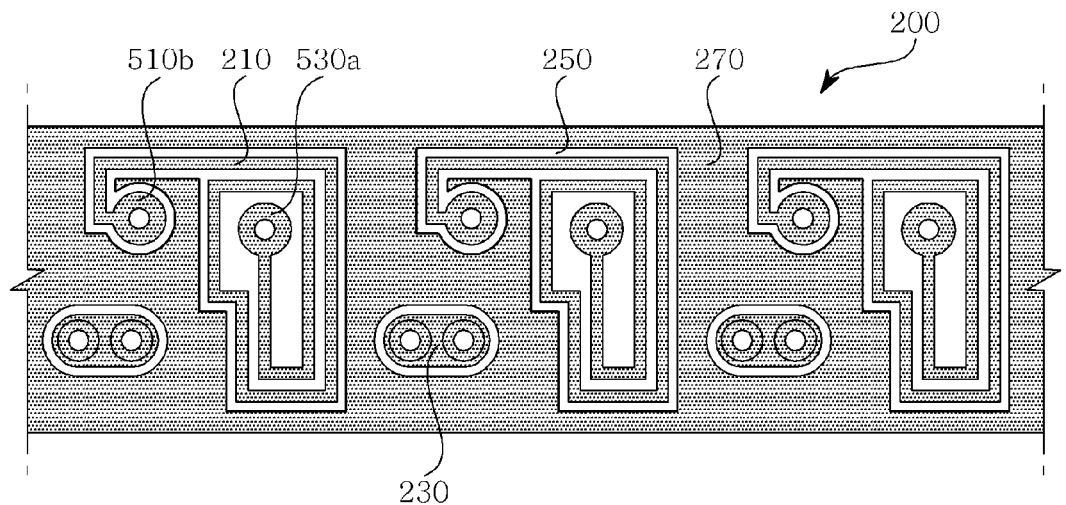
FIG. 4 is a plan view showing a first metal layer of the electromagnetic bandgap structure shown in FIG. 2.
Figure 5:
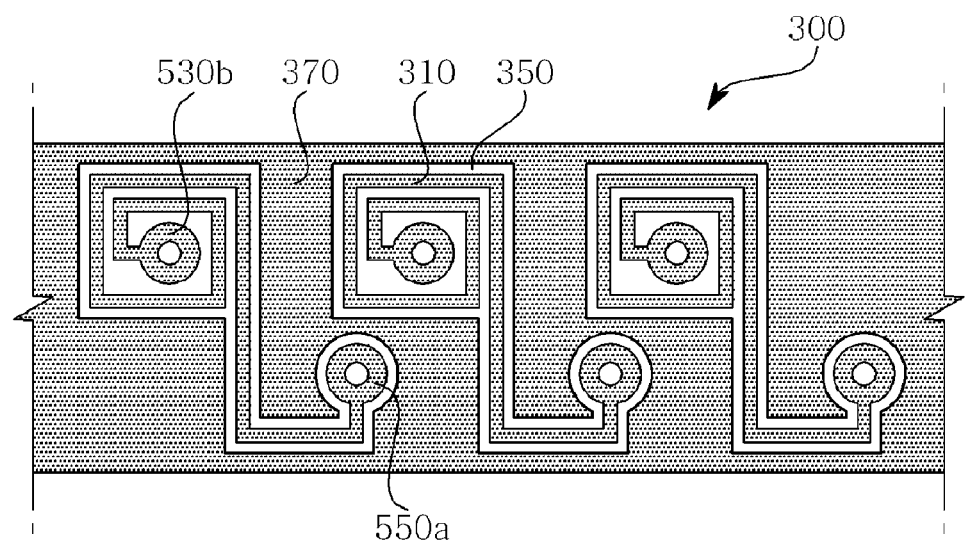
FIG. 5 is a plan view showing a second metal layer of the electromagnetic bandgap structure shown in FIG. 2.

FIG. 2 is a schematic view showing an electromagnetic bandgap structure according to an embodiment of the present invention, FIG. 3 is a plan view showing a conductive layer 100 of the electromagnetic bandgap structure shown in FIG. 2, FIG. 4 is a plan view showing a first metal layer 200 of the electromagnetic bandgap structure shown in FIG. 2, and FIG. 5 is a plan view showing a second metal layer 300 of the electromagnetic bandgap structure shown in FIG. 2. In FIG. 2, some of components of the bandgap structure are omitted for the sake of providing a clear explanation of the present invention.

As shown in FIG. 2, the bandgap structure according to this embodiment of the present invention comprises a conductive layer 100 including a plurality of conductive plates, a metal layer 200 disposed under the conductive layer 100 and including first stitching patterns 210 one of which is electrically connected to a first conductive plate 110*a* of the plurality of conductive plates, and a second metal layer 300 disposed under the first metal layer 200 and including second stitching patterns 310 one of which is electrically connected to both one of the first stitching patterns 210 and a second adjacent conductive plate 110*b* of the plurality of conductive plates.

In this regard, a first dielectric layer, which is disposed between the conductive layer 100 and the first metal layer 200, and a second dielectric layer, which is disposed between the first metal layer 200 and the second metal layer 300, are omitted from the drawings for the sake of providing a clear illustration. The dielectric layers may be made of insulating material, such as prepreg including epoxy resin, which is typically used for the interlayer insulating of the printed circuit board.

The conductive layer 100 is made of electrically conductive material, and may be a metal layer made of electrically conductive metal such as gold, silver, copper and the like. The conductive layer 100 may be a power layer or a ground layer formed on the printed circuit board.

The conductive layer 100 is composed of the plurality of conductive plates which are arranged so as to be spaced apart. Although the conductive layer 100 may be composed of only conductive plates which are separated from each other, it may further include a peripheral part 170 which has clearances defined between the peripheral part and the conductive plates, as shown in FIG. 2.

The plurality of conductive plates are separated and insulated from each other in the conductive layer 100, and are electrically connected to each other via the first stitching patterns 210 and the second stitching patterns 310. More specifically, as appreciated from FIG. 2, the first conductive plate 110a of the plurality of conductive plates is electrically connected to the second conductive plate 110b of the plurality of conductive plates through a first via 510, the first stitching pattern 210, a second via 530, the second stitching pattern 310 and a third via 550 in this order. The vias and the stitching patterns, which are disposed between the first conductive plate 110a and the second adjacent conductive plate 110b, may be collectively referred to as a stitching via. All the plurality of conductive plates formed in the conductive layer 100 are electrically connected to each other through the stitching vias. In this embodiment, the conductive plates are also electrically connected to the peripheral part 170 included in the conductive layer 100 through the stitching vias.

Figure 7:
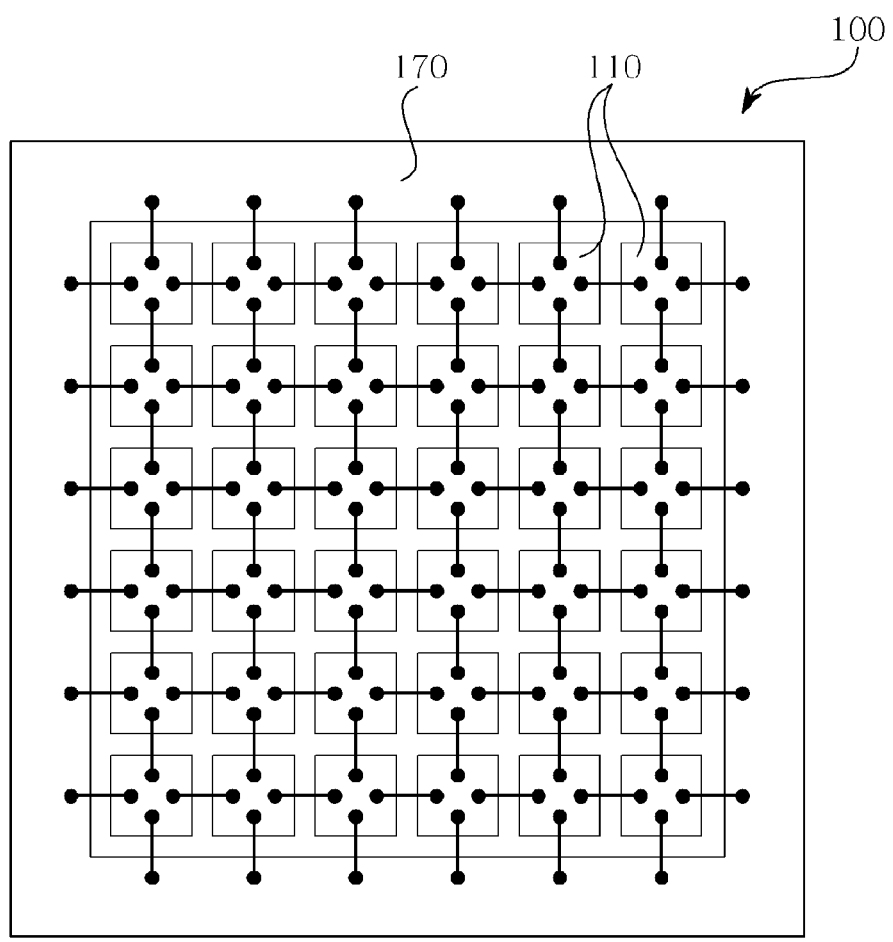
FIG. 7 is a plan view showing a conductive layer which is composed of a plurality of conductive plates and a peripheral part.

FIG. 7 illustrates the conductive layer 100 which is composed of the plurality of conductive plates and the peripheral part 170. As shown in the drawing, the plurality of conductive plates is electrically connected to the peripheral part 170 through the stitching vias.

Although the conductive plates illustrated in this embodiment are shown as having only the same rectangular shape, the conductive plates may have any one of various shapes such as circular, triangular or hexagonal shapes other than the rectangular shape. Accordingly, the scope of the present invention should not be construed as being limited to the shape shown in the drawing. Furthermore, the plurality of conductive plates does not need to be of the same size, and may be of various different sizes. In addition, all the plurality of conductive plates does not necessarily need to be formed in the same layer, and may be formed in different layers with stitching vias connected therebetween.

Referring to FIG. 4, the first metal layer 200 is composed of first stitching patterns 210. Like the conductive layer 100, the first metal layer 200 may also be made of electrically conductive material, for example, gold, silver, copper and the like.

In this regard, although the first metal layer 200 may be composed of only the stitching patterns 210 which are separated from each other, it may further include a first peripheral part 270 which has clearances defined between the first peripheral part and the stitching patterns 210. At this point, the first peripheral part 270 and the first stitching patterns 210 are electrically insulated from each other. The first peripheral part 270 may serve as a power layer or a ground layer in the printed circuit board.

Each of the first stitching patterns 210 is electrically connected at one end thereof to a lower land 510b of the first via 510, and is electrically connected at the other end thereof to an upper land 530a of the second via 530. The first via 510 penetrates through the first dielectric layer so as to connect the upper land 510a of the first via 510 formed in the first conductive plate 110a with the lower land 510b of the first via 510 formed in the first metal layer 200. In other words, the first via 510 functions to electrically connect the first conductive plate 110a to the first stitching pattern 210.

The first via 510 may be composed of a plating layer formed on an internal surface of a via-hole formed in the first dielectric layer or of conductive filler (plating filler, conductive paste, etc.) which is charged in a via-hole formed in the first dielectric layer.

The first stitching pattern 210 may include a pattern part which is configured to have a spiral shape, a staggered shape or a curved horseshoe shape. More specifically, the first stitching pattern 210, which is connected between the lower land 510b of the first via 510 and the upper land 530a of the second via 530, may be connected in a curved manner between the lower land 510b of the first via 510 and the upper land 530a of the second via 530 so as to form a longer electrical connection, rather than being connected in a linear manner therebetween. All the first stitching patterns 210 do not need to have the same shape, and may be linearly configured depending on a desired structure. In this embodiment, the first stitching patterns have a spiral shape.

Referring to FIG. 5, the second metal layer 300 is composed of the second stitching patterns 310. The second metal layer 300 may also be made of electrically conductive material, for example, gold, silver, copper and the like.

In this regard, although the second metal layer 300 may be composed of only the second stitching patterns 310 which are separated from each other, it may further include a second peripheral part 370 which has clearances defined between the second peripheral part and the second stitching patterns 310. At this point, the second peripheral part 370 and the second stitching patterns 310 are electrically insulated from each other. The second peripheral part 370 may serve as a power layer or a ground layer in the printed circuit board.

Each of the second stitching patterns 310 is electrically connected at one end thereof to a lower land 550b of the second via 530, and is electrically connected at the other end thereof to a lower land 550a of the third via 550. The second via 530 penetrates through the second dielectric layer so as to connect the upper land 530a of the second via 530 formed in the first metal layer 200 with the lower land 530b of the second via 530 formed in the second metal layer 300. In other words, the second via 530 functions to electrically connect the first stitching pattern 210 to the second stitching pattern 310.

Meanwhile, the third via 550 penetrates through the first and second dielectric layers so as to connect the upper land 550b of the third via 550 formed in the second conductive plate 110b with the lower land 550a of the third via 550 formed in the second metal layer 300. Although the third via 550 may be composed of a single via that passes through a through-hole formed in the first metal layer 200 so as to directly connect the second conductive plate 110b to the second metal layer 300, it may be a staggered via that is composed of a third upper via 553 adapted to connect the upper land 550b of the third via 550 of the second conductive plate 110b to a connection land 230 formed in the first metal layer 200, and a third lower via 551 adapted to connect the connection land 230 formed in the first metal layer 200 to the lower land 550a of the third via 550 of the second metal layer 300.

Like the first via 510, the second via 530 and the third via 550 may also be composed of a plating layer formed on an internal surface of the via-hole in the second dielectric layer or conductive filler (plating filler or conductive paste) which is charged in the via-hole.

The second stitching pattern 310 may include a pattern part which is configured to have a spiral shape, a staggered shape or a curved horseshoe shape. More specifically, the second stitching pattern 310, which is connected between the lower land 530b of the second via 530 and the lower land 530b of the second via 530, may be connected in a curved manner between the lower land 530b of the second via 530 and the lower land 550a of the third via 550 so as to have a longer electrical connection, rather than being connected in a linear manner therebetween. All the second stitching patterns 310 do not need to have the same shape, and may be linearly configured depending on a desired structure. In this embodiment, the second stitching patterns 310 may have a spiral shape.

Figure 6:
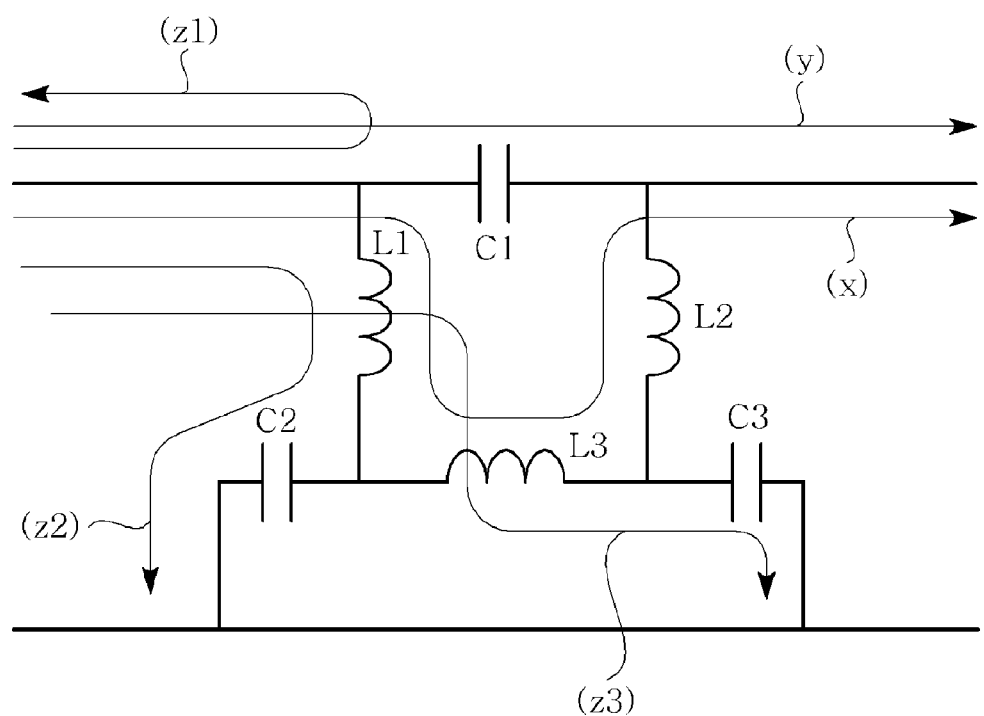
FIG. 6 is an equivalent circuit schematic of the electromagnetic bandgap structure according to the embodiment of the present invention.

Referring to FIG. 6, there is shown an equivalent circuit schematic of the electromagnetic bandgap structure which is constructed in the above-described manner. The equivalent circuit schematic in FIG. 6 illustrates an embodiment in which the second metal layer 300 includes the second peripheral part 370 whereas the first metal layer 200 does not include the first peripheral part 270. In the comparison of the electromagnetic bandgap structure shown in FIG. 2 with the equivalent circuit schematic shown in FIG. 6, an inductance component L1 corresponds to the first via 510 and the second via 530, an inductance component L2 corresponds to the third via 550, and an inductance component L3 corresponds to the first stitching pattern 210 and the second stitching pattern 310. Character "C1" represents a capacitance component caused by the conductive layer 100 and the other dielectric and metal layers disposed on the conductive layer 100, and characters "C2" and "C3" represent a capacitance component caused by the second peripheral part 370 and the other dielectric and metal layers disposed under the second peripheral part 370.

As shown in the drawing, in order for the electromagnetic bandgap structure to have a stop-band of a desired bandwidth, the inductance component L3 caused by the first stitching pattern 210 and the second stitching pattern 310 must be sufficiently provided. To meet the requirement, the first stitching pattern 210 and the second stitching pattern 310 must be sufficiently long. In this case, when the stitching patterns are linearly configured, a size of the electromagnetic bandgap structure is inevitably increased. Consequently, the stitching patterns having the increased size can be accommodated in the electromagnetic bandgap structure only when a size of the conductive plates or a spacing between the conductive plates is increased.

Accordingly, in order to realize provision of a sufficient inductance value and a compact bandgap structure, the first stitching pattern 210 and the second stitching pattern to 310 must not be configured to have a linear shape but must have a nonlinear pattern such as a spiral shape, a staggered shape or a curved horseshoe shape. Particularly, as shown in FIGS. 2, 4 and 5, it is experimentally proven that the most efficient configuration of the stitching patterns has a spiral shape.

Figure 8:
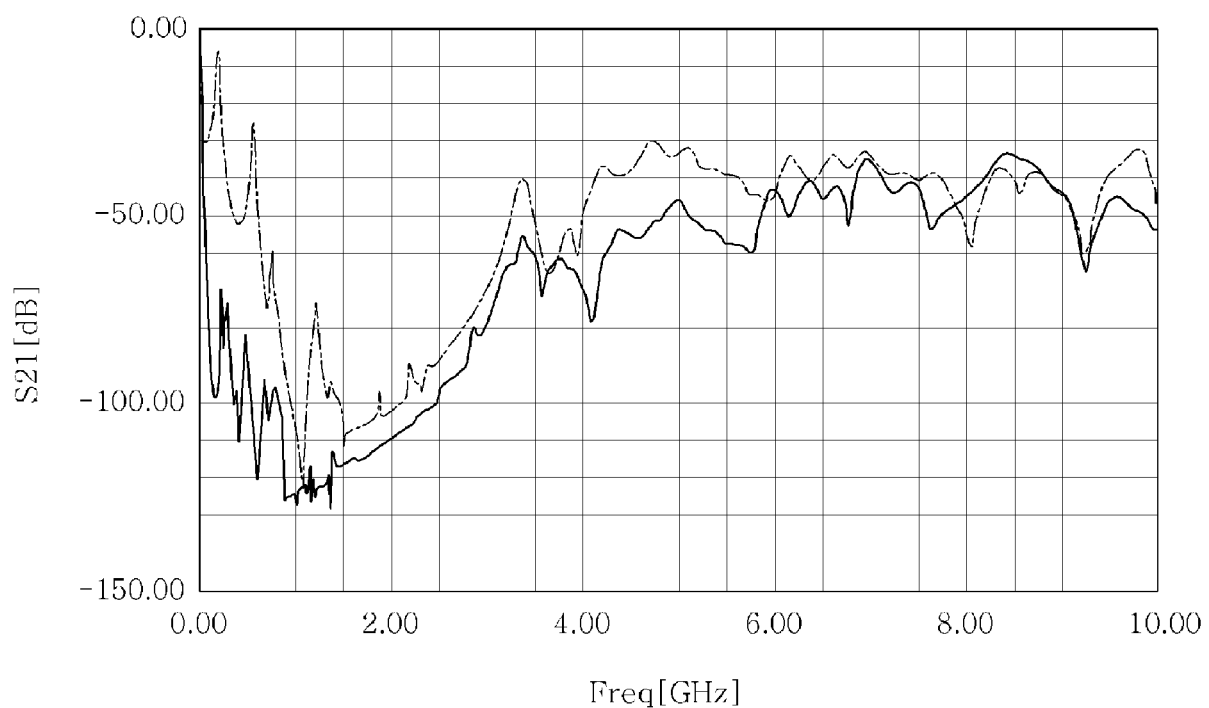
FIG. 8 is a graph showing frequency response characteristics of the electromagnetic bandgap structure according to the embodiment of the present invention.

FIG. 8 is a graph showing frequency response characteristics of the electromagnetic bandgap structure according to this embodiment. Referring to the graph, frequency response characteristics of the electromagnetic bandgap structure which is constructed of the conductive plates having a dimension of 1 mm×1 mm and the first and second stitching patterns 210 and 310 having a spiral shape can be appreciated.

Referring to FIG. 8, it will be noted that the stop-band appears at a signal frequency band of 0.6 GHz-3.3. GHz when noise is at a value of −60 dB. In other words, this embodiment can provide the electromagnetic bandgap structure which is capable of forming the stop-band of a desired bandwidth using a small cell size of 1 mm×1 mm.

The electromagnetic bandgap structure according to this embodiment includes stitching patterns formed in two layers different from the conductive layer 100, and thus enables realization of a stop-band of a desired bandwidth in a compact structure.

Even though a printed circuit board including the electromagnetic bandgap structure according to this embodiment accommodates a large number of electronic circuits, there is no electromagnetic interference between the electronic circuits, thus drastically reducing the occurrence of noise.

As described above, the electromagnetic bandgap structure according to the present invention includes stitching patterns formed in two layers different from the conductive layer, thus enabling formation of a stop-band of a desired bandwidth in a compact structure.

Furthermore, a printed circuit board including the electromagnetic bandgap structure according to the present invention can drastically reduce noise generation without generating electromagnetic interference between electronic circuits even if it includes a large number of to electronic circuits.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. An electromagnetic bandgap structure comprising:
   a conductive layer including a plurality of conductive plates;
      a first metal layer disposed under the conductive layer and including a first stitching pattern electrically connected to a first conductive plate of the plurality of conductive plates; and
      a second metal layer disposed under the first metal layer and including a second stitching pattern electrically connected to both the first stitching pattern and a second conductive plate of the plurality of conductive plates;
      wherein the first stitching pattern includes a pattern part having a spiral shape;
   wherein the second stitching pattern includes a pattern part having a spiral shape.

2. The electromagnetic bandgap structure according to claim 1, further comprising:
   a first dielectric layer disposed between the conductive layer and the first metal layer;
   a second dielectric layer disposed between the first metal layer and the second metal layer;
   a first via penetrating through the first dielectric layer so as to form an electrical connection between the first conductive plate and the first stitching pattern;
   a second via penetrating through the second dielectric layer so as to form an electrical connection between the first stitching pattern and the second stitching pattern; and
   a third via penetrating through the first and second dielectric layers so as to form an electrical connection between the second conductive plate and the second stitching pattern.

3. The electromagnetic bandgap structure according to claim 1, wherein the conductive layer includes a peripheral part surrounding the plurality of conductive plates with clearances formed therebetween.

4. The electromagnetic bandgap structure according to claim 1, wherein the first metal layer includes a first peripheral part surrounding the first stitching pattern with clearances formed therebetween.

5. The electromagnetic bandgap structure according to claim 1, wherein the second metal layer includes a second peripheral part surrounding the second stitching pattern with clearances formed therebetween.

6. The electromagnetic bandgap structure according to claim 1, wherein the plurality of conductive plates is electrically connected to each other through the first and second stitching patterns.

7. The electromagnetic bandgap structure according to claim 1, wherein the conductive layer is a power layer or a ground layer.

8. The electromagnetic bandgap structure according to claim 3, wherein the peripheral part is electrically connected to the plurality of conductive plates.

* * * * *